United States Patent [19]

Pentchev et al.

[11] Patent Number: 4,980,615
[45] Date of Patent: Dec. 25, 1990

[54] ELECTRON BEAM CONTROL CIRCUIT IN ELECTRON BEAM EVAPORATORS WITH ALTERNATING ACCELERATION VOLTAGES

[76] Inventors: Vassil B. Pentchev, 6, Silistra Street; Venzislav I. Valkov, 22, A.Kantchev Street; Venzislav G. Dimitrov, 8, Kimsomolska Street; Vladimir S. Eterski, 50, N. Rilski Street, all of, Russe, Bulgaria

[21] Appl. No.: 357,396

[22] Filed: May 25, 1989

Related U.S. Application Data

[63] Continuation-in-part of Ser. No. 74,409, Jul. 16, 1987, abandoned, which is a continuation-in-part of Ser. No. 22,462, Mar. 6, 1987, abandoned.

[30] Foreign Application Priority Data

Mar. 6, 1986 [BG] Bulgaria .................................. 73938

[51] Int. Cl.$^5$ ............................................. H01J 29/58
[52] U.S. Cl. ................................. 315/382; 315/111.81
[58] Field of Search .................... 315/382, 386, 111.81, 315/111.91

[56] References Cited

U.S. PATENT DOCUMENTS 3,714,505 1/1973 Lukacs ................................ 315/382
3,952,228 4/1976 Reader et al. ...................... 315/382
4,039,899 8/1977 Battjes et al. ...................... 315/382

Primary Examiner—Theodore M. Blum

[57] ABSTRACT

This invention relates to a circuit controlling the electron beams in electron beam evaporators with AC acceleration voltages, finding application in evaporators for welding, fusing and evaporation of metals, materials, lithography, etc. It controls electron beam evaporators, avoiding disadvantages of existing devices which need rectification and qualitative filtering of the acceleration voltage, thus making the invention inexpensive. The circuit includes a reduced number of units and uses AC amplifiers. Focusing adjustable amplifiers and deflection along axes X and Z are respectively connected to focusing and deflection lenses; the output of a square root extraction means is connected to the input of adjustable AC focusing amplifier, the input of which is connected to output of a first phase shift means whose input is connected to the output of a voltage source coinciding in a curve shape, frequency and phase with the acceleration voltage of the respective electron beam. Either electrostatic or electromagnetic focusing lenses can be used. When the focusing lens is electrostatic, the input of the adjustable focusing amplifier is directly coupled to the output of the voltage source. A calculation unit for correcting the focus ratio depending on the electron beam length is connected between the outputs of the deflection amplifiers and the input of the focusing amplifier for the respective electron beam.

7 Claims, 2 Drawing Sheets

1

ELECTRON BEAM CONTROL CIRCUIT IN ELECTRON BEAM EVAPORATORS WITH ALTERNATING ACCELERATION VOLTAGES

This application is a continuation-in-part of our co-pending application Ser. No. 074,409, filed July 16, 1987 now abandoned which in turn is a continuation-in-part of application Ser. No. 022,462 filed Mar. 6, 1987, now abandoned.

FIELD OF THE INVENTION

This invention relates to a circuit for controlling the electron beams in electron beam evaporators supplied with alternating acceleration voltages, which shall find application in electron beam evaporators for welding, fusing and evaporation of metals, zone material cleaning, dimension machining, distillation and refining, coating applications, lithography, etc.

BACKGROUND OF THE INVENTION

The electromagnetic lens and the deflection system in the well-known control circuits for electron beams in electron beam evaporators supplied with a direct acceleration voltage are connected to a DC source (adjustable DC amplifier). For stabilization of the electron beam, the currents across the electromagnetic lens and deflection coils are controlled according to the following formula:

$$I = k \cdot \sqrt{\frac{Ib}{\sqrt{Ub}}} \qquad \text{(formula I)}$$

where k is a constant, Ib is the current of the electron beam, Ub is the acceleration voltage.

There is a well-known circuit containing an acceleration voltage divider, the output of which, across a means for extracting root of four, is connected to one of the inputs of a divider unit. The output of a means for extracting a square root of the electron beam current is connected to the other input of that unit. The output of the divider unit is connected to the input of a control unit the output of which is connected to the focusing lens. See. USSR Author's Certificate No. 10 50 011 A, SU.

It is a disadvantage of the known circuits that they control electron beams supplied with direct acceleration voltage only, which need rectification and filtering of the acceleration high voltage which makes the equipment more expensive, reduces its reliability and reduces its efficiency. The known circuit works following the formula (I) which is the reason for increasing the number and complexity of the units. Furthermore, DC amplifiers are used in the known electron beam control units, and these amplifiers are plagued by their inherent zero drifts, fluctuations, complex operation, etc.

It is an object of this invention to provide a circuit for electron beam control in electron beam evaporators with alternating acceleration voltages, having a reduced number of high voltage components, improved reliability and efficiency factor, being simultaneously less expensive; for correcting the focus ratio depending on the electron beam length; for electron beam stabilization by reduced number of units and using AC amplifiers.

SUMMARY OF THE INVENTION

The electron beam control circuit for electron beam evaporators with alternating acceleration voltages contains adjustable AC amplifiers for focusing, deflection along axis X and deflection along axis Z, to the output of which are connected respectively focusing deflection along axis X and deflection along axis Z coils. When the focusing lens is electromagnetic, the output of first square root extraction means is connected to the first input of the adjustable AC focusing amplifier, while the input of the first root extraction means is connected to the output of a first adjustable phase shift means. The input of the first phase shift means is connected to the output of a voltage source whose voltage coincides by curve shape, frequency and phase with the acceleration voltage of the respective electron beam. The input of a second adjustable phase shift means of the deflection unit is also connected to the output of the same voltage source, and the output of the second phase shift means is connected to the input of a second square root extraction means. The inputs of the adjustable AC amplifiers for deflection along the X axis and for deflection along the Z axis are connected to the output of the second root extraction means. A calculation unit for correcting the focus ratio depending on the changes of the electron beam trajectory is connected between the outputs of the amplifiers for the deflection along the X axis and the Z axis and the respective amplifier input for focusing.

When the focusing lens is electrostatic and the deflection system is electromagnetic, the first input of the adjustable amplifier for focusing is directly coupled to the output of the voltage source whose voltage coincides by shape, frequency and phase with the acceleration voltage of the respective electron beam.

The advantages of the present invention include: an electron beam controlability in evaporators with alternating acceleration voltage having reduced number of high voltage components resulting in smaller costs, reduced overall dimensions and the improved reliability and efficiency; stabilizing of the electron beam focusing and deflection by reduced number of circuit units and using AC amplifiers.

BRIEF DESCRIPTION OF THE DRAWINGS

With these and other objects in view, which will become apparent in the following detailed description, the present invention, which is shown by example only, will be clearly understood in connection with the accompanying drawing, in which.

DESCRIPTION OF THE PREFERRED EMBODIMENTS

The circuit of the invention comprises an adjustable AC focusing amplifier 1, an adjustable AC deflection amplifier (X-axis) 2, and adjustable AC deflection amplifier (Z-axis) 3. The outputs of each amplifier are connected respectively to focusing lens 4, X-axis deflection coil 5, and Z-axis deflection coil 6.

Figure 1:
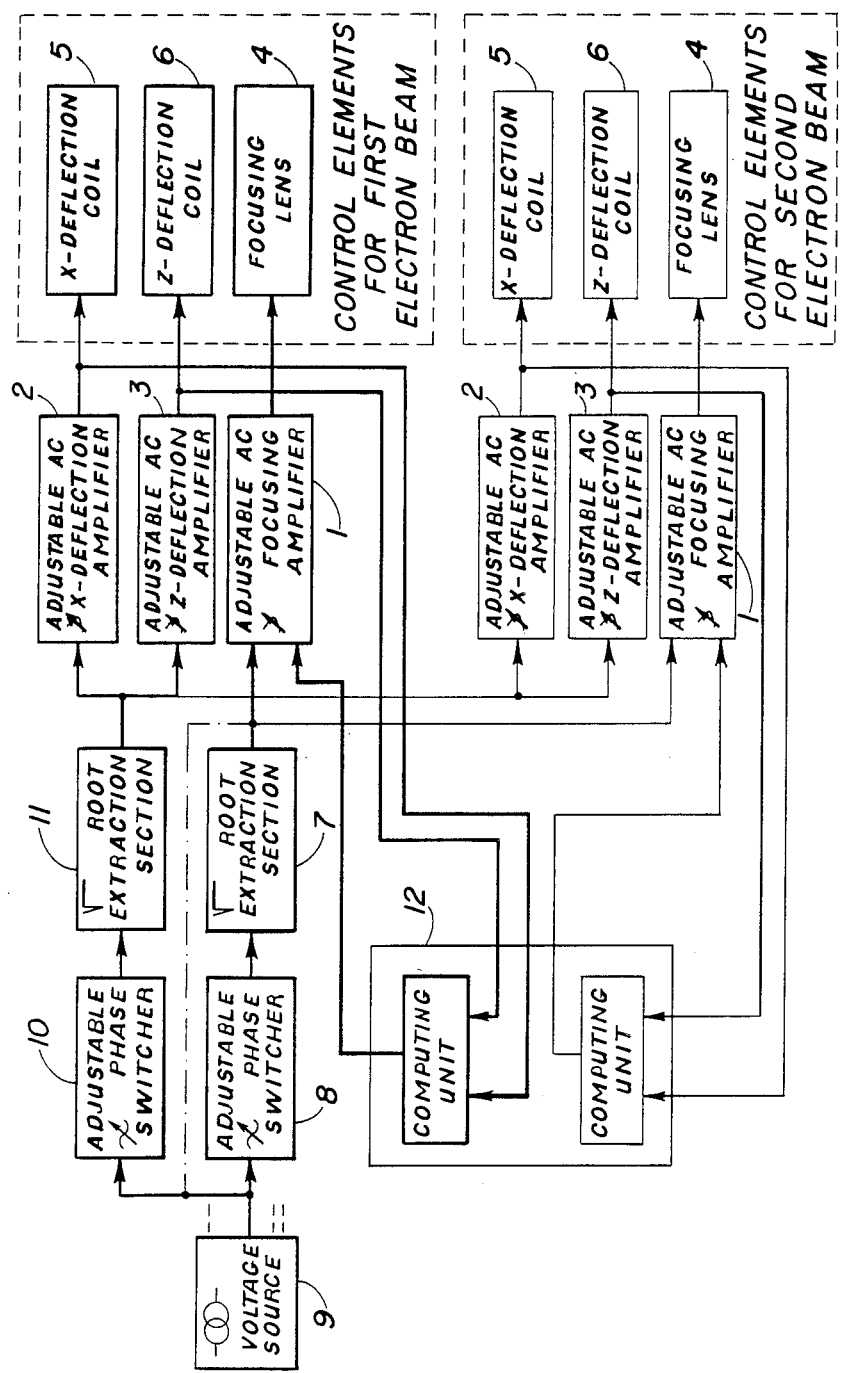
FIG. 1 illustrates, in flow chart form, a model application of the circuit for controlling two electron beams fed by one phase. The phantom line in the drawing represents an alternate embodiment when the focusing lens is electrostatic and the deflection system is electromagnetic. The bold lines indicate a circuit for controlling one electron beam with acceleration voltage half-waves of one polarity and the thin lines represent additional circuitry used to control a second electron beam with volatge half-waves of a different polarity.
Figure 2:
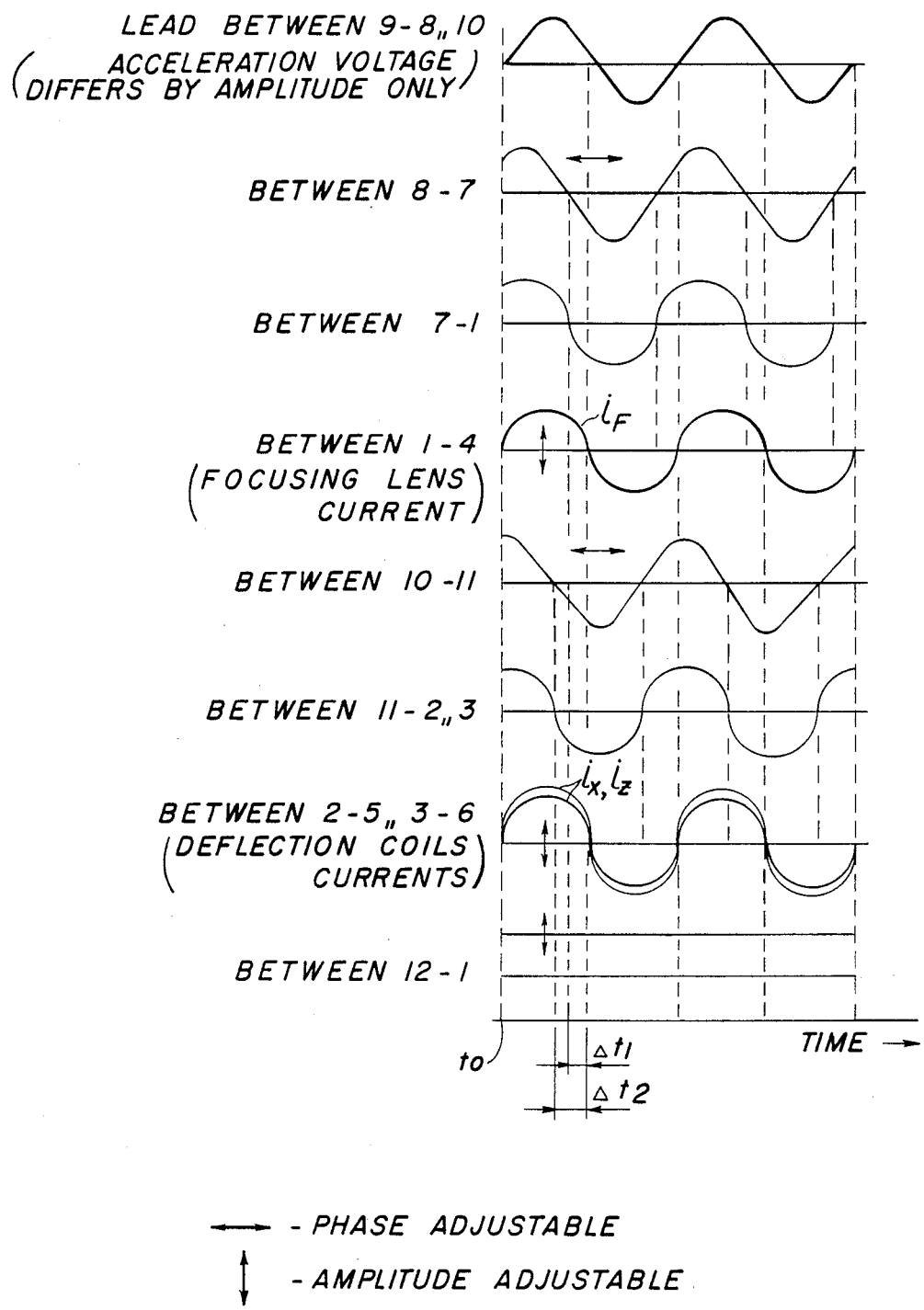
FIG. 2 shows the wave form of signals at various points in the circuit illustrated in FIG. 1.

The amplifiers all receive input signals from a common voltage source 9, whose voltage coincides by curve shape, frequency and phase with the acceleration voltage of the electron beam. (See FIG. 2.) The first input of the focusing amplifier 1, is supplied either directly from source 9 (as will be discussed below) or through a circuit comprising a first adjustable phase shift means 8 and a first square root extraction means 7 as shown in the figure.

Input signals to the deflection amplifiers 2, 3, are provided from the source 9 through a second adjustable phase shift means 10 and a second square root extraction means 11 as shown in the figure.

The invention provides a calculation unit 12 for correcting the focus ratio of the electron beam depending on the change of the trajectory length of the electron beam. Calculation unit 12 is connected by its inputs to the outputs of deflection amplifiers 2, 3, as shown in the figure. The output of calculation unit 12 is connected to the second input of the adjustable focusing amplifier 1.

Calculating unit 12 is described in further detail below in connection with the operation of the invention. It should be noted here, however, that the calculating unit need not compute in real time, but may comprise a memory containing the results of previously completed calculations.

When the focusing lens 1 is electrostatic and the deflection system 5, 6 is electromagnetic, the adjustable focusing amplifier input 1 is powered directly by the output of the voltage source 9 as shown by phantom line in the figure.

The circuit of the invention operates as follows: When there is AC voltage accelerating the electrons of the electron beam, the electron velocities change in time. The focus ratio and the deflection along X and Z axes also change. In order that they remain constant, it is necessary that the force of the electromagnetic coils' 4, 5 and 6 electromagnetic effect on the electrons should change synchronously with the acceleration voltage Ub and proportionally to square root of the instantaneous value of this voltage Ub. In normal space charge operation of the electron beam $$p = \frac{Ib}{Ub^{3/2}} = \text{constant}; \frac{I}{k} = \sqrt{\frac{Ib}{\sqrt{Ub}} \cdot \frac{Ub}{Ub}} =$$

$$\sqrt{\frac{Ib}{Ub^{3/2}} \cdot Ub} = \sqrt{p} \cdot \sqrt{Ub}$$

i.e. it is enough to extract a square root of Vb for stabilization of the electron beam. The root extraction means 7 (or respectively 11) satisfies this requirement for proportionality to the square root of the instantaneous value of the acceleration voltage Ub.

Data for the instantaneous value, the frequency and the phase of the acceleration voltage Ub is obtained from the voltage source 9. As a result of the coils' inductances, the phase of the current across them, thence of the magnetic flux formed, lags behind in comparison with the voltage phase. Their synchronization (phase coincidence) with the acceleration voltage vector is achieved by means of the phase shift means 8 (respectively 10). The phase shift means' presence provides for the circuit a controlability of electron beams with AC acceleration voltages. Two separate phase shift means are required in this case where the Q factor of the focusing lens 4 is different from that of the deflection coils 5 and 6. The Q factor is the relationship between the inductive reactance at a set frequency and the equivalent active series resistance of the coil. The Q factor determines the value of phase shift between the current and the voltage.

The root extracted and synchronized signals of every phase enter adjustable AC amplifiers 1, 2, and 3 supplying electromagnetic lens 4 and coils 5 and 6. Each phase has two separate amplifiers for focusing 1, for deflection along the X axis 2 and deflection along the Z axis 3 as two electron beam evaporators are supplied by one phase of the alternating acceleration voltage.

When electrostatic focusing lenses 4 are used, the force (intensity) of the effect of the electric field on the electrons is synchronous and proportional to the instantaneous value of the applied voltage Ub. Due to this, the information for the frequency and phase of the acceleration voltage Ub is directly fed from the voltage source to the first input of the adjustable focusing amplifier 1. This case is shown by the phantom line in the figure.

In the case of a deflection of a constantly focused electron beam the focusing point describes part of the surface of a sphere whose center coninicide with the center of the deflection system. At the same time the processed surface is situated in the plane X-Y which demands a correction of the focus ratio in case of a change of the deflection along X or along Z, which is performed by the calculation unit 12.

Given the instantaneous values of the acceleration voltage, the current through coils 5 and 6 determine a single direction of the electron beam. If the processed surface is not spherical with its center coinciding with the center of the deflection system (5, 6), then the length of the beam changes when it moves in different directions. The length of the beam, i.e. the necessary focusing depends on the cluster spacing of the center of the deflection system and the processed surface, as well as on the direction of the beam. The adjustment of focusing is made by calculation unit 12, based on preset information about the cluster spacing of the deflection system and the processed surface, on the basis of the current through lenses 5 and 6.

Although the invention is described and illustrated with reference to a plurality of preferred embodiments thereof, it is to be expressly understood that it is in no way limited to the disclosure of such preferred embodiments but is capable of numerous modifications within the scope of the appended claims.

We claim:

1. An electron beam control circuit for electron beam evaporators, supplied with alternating acceleration voltages comprising:
    an adjustable focusing amplifier, an adjustable X-axis deflection amplifier, and an adjustable Z-axis deflection amplifier;
    said focusing amplifier driving a focusing lens and each of said deflection amplifiers driving respective deflection means;
    said electron beam being driven by alternating acceleration voltage of determinable curve shape, phase and frequency;
    all of said amplifiers receiving input signals from a common source of voltage, said voltage having a curve shape, phase and frequency coinciding with the shape, phase and frequency of said alternating acceleration voltage driving said electron beam;

said deflection amplifiers receiving input signals from said source of voltage through a circuit comprising adjustable phase shift means having an input and output and a square root extraction means also having an input and an output, the input of said phase shift means being connected to said source and the output of said phase shift means being connected to the input of said root extraction means, said deflection amplifiers receiving input signals from the output of said root extraction means, whereby the currents across each of said deflection means are phase synchronized with a voltage vector of said acceleration voltage; and computing means for adjusting said adjustable focusing amplifier to correct for focusing on a non-spherical target, said computing means having two inputs and one output, each of the inputs of said computing means being connected respectively to the output of one of said deflection amplifiers, the output of said computing means being connected to said adjustable focusing amplifier, whereby when said beam is deflected said computing means adjusts said focusing amplifier to correctly focus said beam on said target at a point on said target corresponding to an amount of X and Z deflection indicated by said deflection amplifiers.

2. An electron beam control circuit as claimed in claim 1 wherein all of said amplifiers are AC amplifiers.

3. An electron beam control circuit as claimed in claim 1 wherein said focusing lens is electrostatic.

4. An electron beam control circuit as claimed in claim 1 wherein said focusing amplifier receives input signals from said source of voltage through a circuit comprising a second adjustable phase shift means having an input and an output and a second square root extraction means also having an input and an output, the input of said second phase shift means being connected to said source and the output of said second phase shift means being connected to the input of said second root extraction means, said focusing amplifier receiving input signals from the output of said second root extraction means, whereby the current of said focusing lens is phase synchronized with said acceleration voltage.

5. An electron beam control circuit as claimed in claim 4 wherein all of said amplifiers are AC amplifiers.

6. An electron beam control circuit as claimed in claim 4 wherein said focusing lens is electromagnetic.

7. An electron beam control circuit as claimed in claim 1, wherein said computing means comprises a memory whereby said amounts of X and Z deflection are cross-referenced to an amount of focusing correction of said adjustable focusing amplifier.

* * * * *